(12) United States Patent
Nagai et al.

(10) Patent No.: US 10,124,406 B2
(45) Date of Patent: Nov. 13, 2018

(54) PRODUCTION APPARATUS AND PRODUCTION METHOD FOR FINE PARTICLES

(71) Applicant: Panasonic Intellectual Property Management Co., Ltd., Osaka (JP)

(72) Inventors: Hisao Nagai, Osaka (JP); Takeshi Koiwasaki, Osaka (JP); Masaaki Tanabe, Hyogo (JP); Takafumi Okuma, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/915,017

(22) Filed: Mar. 7, 2018

(65) Prior Publication Data

US 2018/0290208 A1    Oct. 11, 2018

(30) Foreign Application Priority Data

Apr. 5, 2017 (JP) ................................ 2017-075399

(51) Int. Cl.
  *B22F 9/14* (2006.01)
  *C04B 35/10* (2006.01)
  (Continued)

(52) U.S. Cl.
  CPC .............. *B22F 1/0018* (2013.01); *B22F 9/14* (2013.01); *C04B 35/62834* (2013.01);
  (Continued)

(58) Field of Classification Search
  CPC ...... B22F 1/0018; B22F 9/14; B22F 2201/20; B22F 2999/00; B22F 2202/13;
  (Continued)

(56) References Cited

U.S. PATENT DOCUMENTS 4,732,369 A * 3/1988 Araya .................. C04B 35/626
   264/10
5,935,461 A * 8/1999 Witherspoon .......... B22F 9/082
   219/121.43

(Continued)

FOREIGN PATENT DOCUMENTS

JP    2002-255524    9/2002
JP    2004-263257    9/2004
   (Continued)

*Primary Examiner* — Tracie Y Green
(74) *Attorney, Agent, or Firm* — Wenderoth, Lind & Ponack, L.L.P.

(57) ABSTRACT

A production apparatus for fine particles includes a vacuum chamber, a material supply device, a plurality of electrodes arranged and a collection device connecting to the other end of the vacuum chamber and collecting fine particles, which generates plasma and produces fine particles from the material particles, in which a first electrode arrangement region on the material supply port's side and a second electrode arrangement region apart from the first electrode arrangement region to the collection device's side which respectively cross a direction in which the material flows between the vicinity of the material supply port and the collection device are provided in the intermediate part of the vacuum chamber, and both the first electrode arrangement region and the second electrode arrangement region are provided with a plurality of electrodes respectively to form the electrodes in multi-stages.

14 Claims, 5 Drawing Sheets

(51) Int. Cl.
  *B22F 1/00* (2006.01)
  *H01J 37/32* (2006.01)
  *H05H 1/42* (2006.01)
  *C04B 35/628* (2006.01)

(52) U.S. Cl.
  CPC ......... *H01J 37/32055* (2013.01); *H05H 1/42* (2013.01); *B01J 2219/0809* (2013.01); *B01J 2219/0841* (2013.01); *B01J 2219/0898* (2013.01); *B22F 2201/20* (2013.01); *B22F 2202/13* (2013.01); *B22F 2999/00* (2013.01)

(58) Field of Classification Search
  CPC ................ H05H 1/42; C04B 35/62834; H01J 37/32055; B01J 2219/0841; B01J 2219/0898; B01J 2219/0809
  See application file for complete search history.

(56) References Cited

U.S. PATENT DOCUMENTS

| | | | |
|---|---|---|---|
| 6,358,375 B1 * | 3/2002 | Schwob | ............ B01J 19/088 |
| | | | 204/173 |
| 2004/0062992 A1 | 4/2004 | Kajiura et al. | |
| 2009/0014423 A1 | 1/2009 | Li et al. | |
| 2014/0263190 A1 | 9/2014 | Biberger et al. | |
| 2016/0030910 A1 | 2/2016 | Biberger et al. | |
| 2016/0207113 A1 | 7/2016 | Nagai et al. | |
| 2017/0136546 A1 * | 5/2017 | Nagai | ............ B01J 19/088 |

FOREIGN PATENT DOCUMENTS

| | | |
|---|---|---|
| JP | 2010-533066 | 10/2010 |
| JP | 5573922 B | 8/2014 |
| JP | 2016-131935 | 7/2016 |
| JP | 2016-522734 | 8/2016 |

* cited by examiner

PRODUCTION APPARATUS AND PRODUCTION METHOD FOR FINE PARTICLES

TECHNICAL FIELD

The technical field relates to a production apparatus and a production method for fine particles, which are used for, for example, an electrode material of a lithium-ion battery, a coating material such as on a film material of food packaging or an ink raw material used for electric apparatus wiring and so on.

BACKGROUND

In recent years, fine particles in the order of nanometers have been applied to various devices. For example, fine metal particles of nickel are used for a ceramic capacitor at present, and fine particles with a particle diameter of 200 nanometers or less having good dispersibility are considered to be used for a next generation ceramic capacitor.

Furthermore, fine particles of silicon monoxide (SiOx: x=1 to 1.6) having a lower oxygen content than silicon dioxide are utilized as an antireflection film of an optical lens or a deposition material of a gas-barrier film for food packaging. Recently, application of fine particles to an anode material of a lithium-ion secondary battery is also expected.

Some common methods of producing fine particles in the order of nanometers are: a method of introducing a bulk material as a raw material together with beads such as, ceramic beads and zirconia beads, and miniaturizing the material into particles by mechanical crushing; a method of melting and evaporating a material and spraying the material to air or water to obtain fine particles; and a method of chemically obtaining fine particles by electrolysis or reduction and so on. Among them, a method of producing fine particles in a vapor by using thermal plasma (approximately 10000° C.) such as high-frequency discharge and DC or AC arc discharge is extremely useful from the perspective of producing fine particles with excellent dispersibility, less contamination and composite fine particles formed of plural kinds of materials can be easily composed.

FIG. 4 shows a schematic cross-sectional view of a production apparatus for fine particles utilizing thermal plasma disclosed in JP-A-2004-263257 (PTL 1).

The apparatus is configured to include a material supply device 110 and plural electrodes for generating arc discharge in a reaction chamber 101, a fine particle collection section 103 for collecting fine particles 118, a gas supply pipe (not shown) for supplying gas to the reaction chamber 101, a valve for regulating pressure and a pump 113 for exhausting the gas. After an argon gas is introduced into the reaction chamber 101 from a gas supply pipe and the pressure is regulated, AC power is applied to plural electrodes 104 from plural AC power sources 105 to thereby generate arc discharge 116 as thermal plasma. Material particles 117 in the material supply device 110 are introduced to the generated arc discharge 116 from a vertically downward direction together with a carrier gas. The introduced material particles 117 are evaporated and vaporized by the arc discharge 116, then, rapidly cooled and coagulated in an upper part of the reaction chamber 101 to thereby generate the fine particles 118. The generated fine particles 118 are introduced into the fine particle collection section 103 along the gas flow inside the reaction chamber 101 and collected by a filter inside the fine particle collection section 103.

FIG. 5 shows schematic views of a discharge state in which multi-phase AC arc plasma used in PTL 1 is observed by a high-speed camera at a certain moment. Black triangle marks shown in FIG. 5 represent tip ends 120 of the electrodes 104 shown in FIG. 4 of PTL 1, and six electrodes 104 are arranged radially at intervals of 60 degrees. AC power is applied to the electrodes 104, namely, an electrode E1 to an electrode E6 respectively so that phases of which are shifted by 60 degrees, thereby generating the arc discharge 116 in a planer direction. An arc discharge region 121 at a certain moment shown in FIG. 5 represents a high-temperature region of 5000 degrees or more as a result of measuring a gas temperature by spectroscopic analysis. As shown in FIG. 5 (upper figure), a discharge D1 is generated from the tip end 120 of an electrode E1 at a certain moment, a discharge D4 is generated from the tip end 120 of an electrode E4, a discharge D2 is generated from an electrode E2 at a next moment (see FIG. 5 (middle figure)) and a discharge D5 is generated from an electrode E5 sequentially. The arc discharges D1 to D6 are sequentially generated clockwise from the electrode E1 to the electrode E6, and discharges are generated to the electrode E1 repeatedly. At that time, the arc discharge D1 itself overlaps with discharges from other electrodes 104 while swinging from the left side to the right side with respect to the electrode 104 to increase the discharge region 121, then, disappears at a next moment. The discharges from the electrode E1 to the electrode E6 are driven at 60 Hz as AC power and the arc discharge is repeatedly generated at 16.7 ms as one cycle.

However, there are problems such as a material not processed at all (unprocessed) or a material in which the process ends in a melting stage as the temperature is insufficient to be evaporated are generated only by the discharges from the electrode E1 to the electrode E6, which leads to low processing efficiency.

SUMMARY

An object to the present disclosure is to provide a production apparatus and a production method for fine particles capable of improving processing efficiency of fine particles and increasing the production amount by considering the above problems.

In order to achieve the above object, a production apparatus for fine particles according to an aspect of the present disclosure includes a vacuum chamber, a material supply device connected to one end side of the vacuum chamber and supplying material particles to the vacuum chamber from a material supply port, a plurality of electrodes arranged in an intermediate part of the vacuum chamber and generating plasma inside the vacuum chamber when AC power phases of which differ from one another is applied to respective electrodes and a collection device connecting to the other end of the vacuum chamber and collecting fine particles, which generates plasma in the vacuum chamber and produces fine particles from the material particles, in which a first electrode arrangement region on the material supply port's side and a second electrode arrangement region apart from the first electrode arrangement region to the collection device's side which respectively cross a direction in which the material flows between the vicinity of the material supply port and the collection device are provided in the intermediate part of the vacuum chamber, both the first electrode arrangement region and the second electrode arrangement region are provided with a plurality of electrodes respectively to form the electrodes in multi-stages and an angle of inclination of the electrodes arranged in the first electrode arrangement region is larger than an angle of inclination of the electrodes arranged in the second electrode arrangement region.

In order to achieve the above object, a production method for fine particles according to another aspect of the present disclosure includes the steps of generating thermal plasma by applying AC power phases of which differ from one another to a plurality of electrodes respectively, which are formed in multi-stages by being arranged respectively in a first electrode arrangement region on a material supply port's side and a second electrode arrangement region apart from the first electrode arrangement region to a collection device's side which respectively cross a direction in which material particles flow in a discharge gas in a vacuum chamber between the vicinity of the material supply port and the fine particle collection device which are provided in an intermediate part of the vacuum chamber, in which an angle of inclination of the electrodes arranged in the first electrode arrangement region is larger than an angle of inclination of the electrodes arranged in the second electrode arrangement region, supplying the material particles into a region of the thermal plasma from the material supply port of a material supply device and generating fine particles by evaporating and vaporizing the material particles to generate a material gas when passing through the region of the thermal plasma and by cooling the material gas rapidly at a moment when the material gas exits from the region of the thermal plasma.

According to the aspects of the present disclosure, the plural electrodes are arranged in multi-stages to form the arc discharge in multi-stages. Therefore, the probability that supplied material particles pass through the region of the arc discharge is increased and unprocessed materials can be reduced. As a result, evaporation efficiency of materials is increased and a large amount of materials can be processed. Therefore, the production apparatus and the production method for fine particles are capable of increasing the amount of fine particles generated and producing the fine particles at low costs.

DESCRIPTION OF EMBODIMENTS

Hereinafter, embodiments of the present disclosure will be explained in detail with reference to the drawings.

First Embodiment

Figure 1:
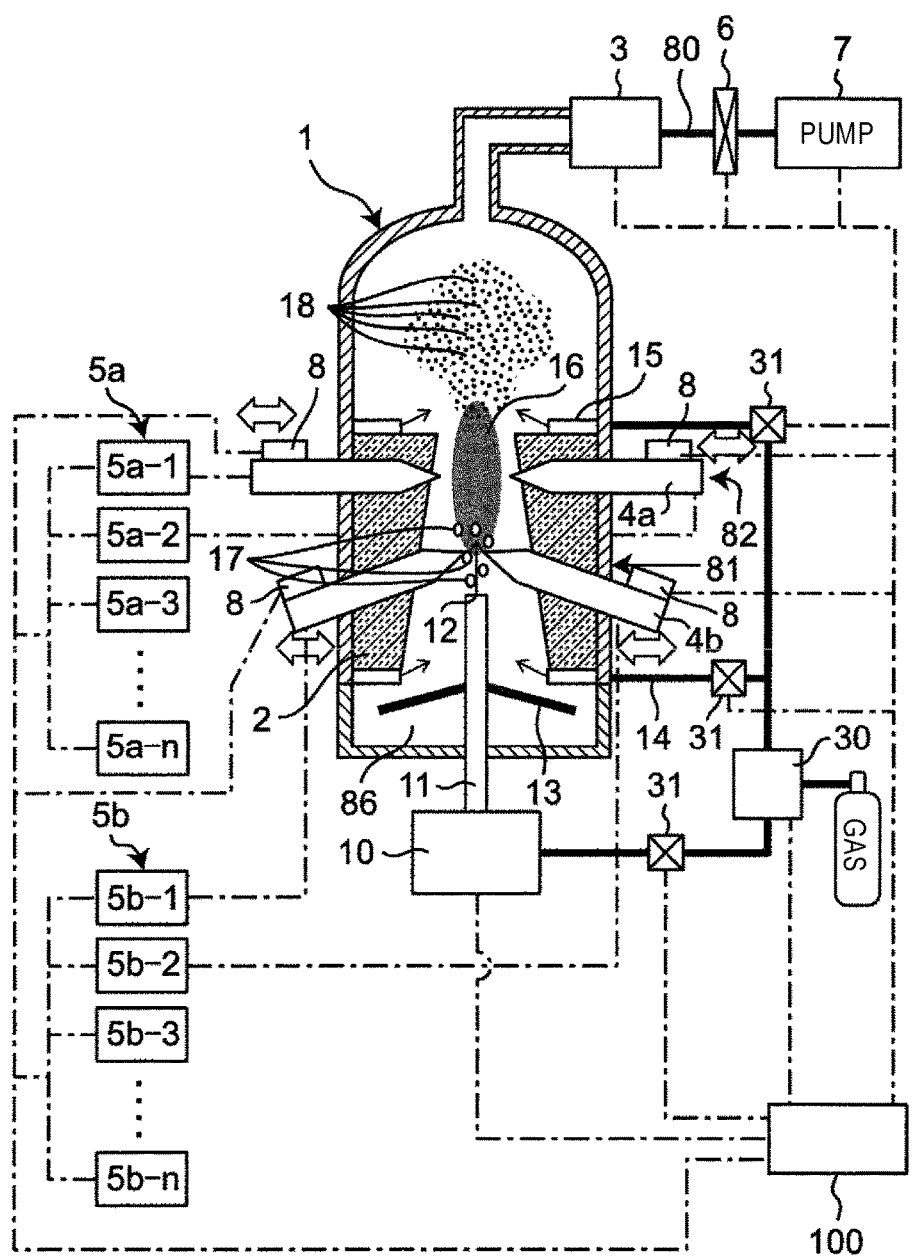
FIG. 1 is a schematic cross-sectional view of a production apparatus for fine particles according to a first embodiment of the present disclosure.
Figure 2A:
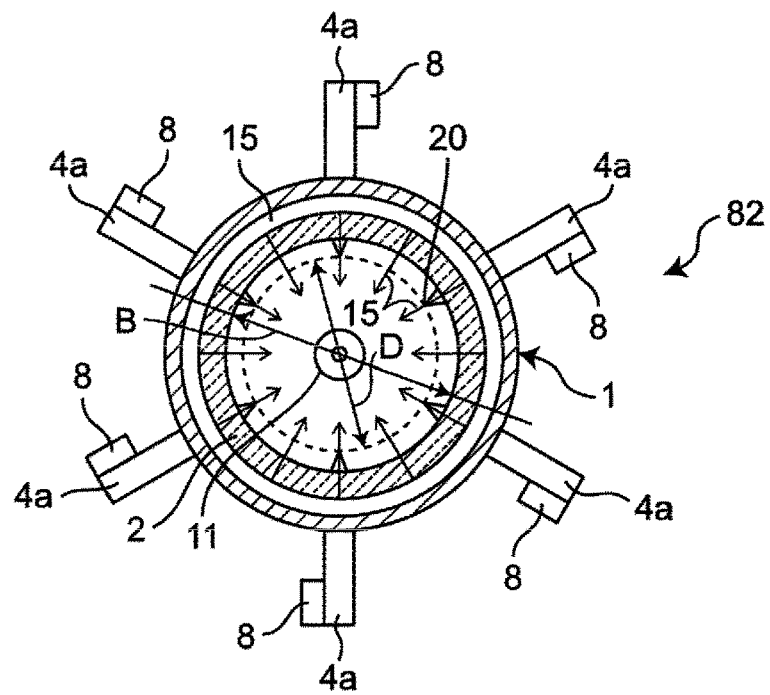
FIG. 2A is a schematic partial cross-sectional plan view in a second electrode arrangement region in the vicinity of upper electrodes in the production apparatus for fine particles according to the first embodiment of the present disclosure.
Figure 2B:
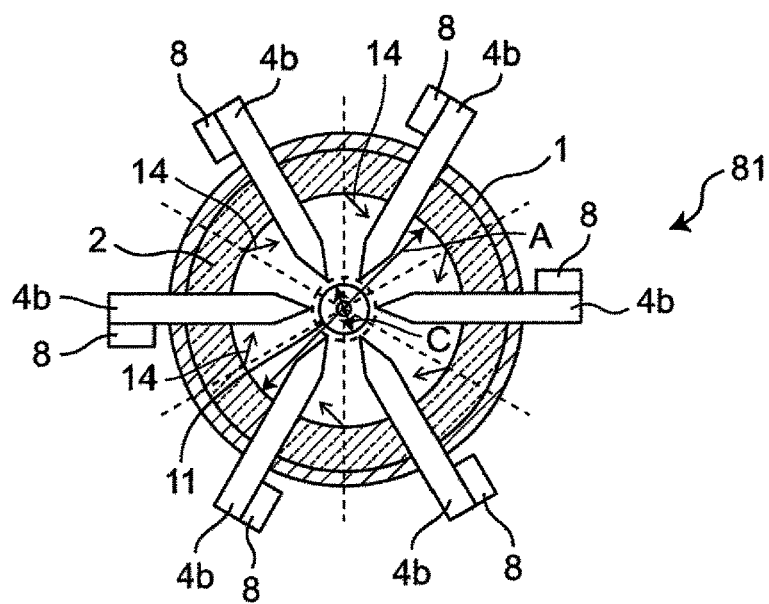
FIG. 2B is a schematic partial cross-sectional plan view in a first electrode arrangement region in the vicinity of lower electrodes in the production apparatus for fine particles according to the first embodiment of the present disclosure.
Figure 3:
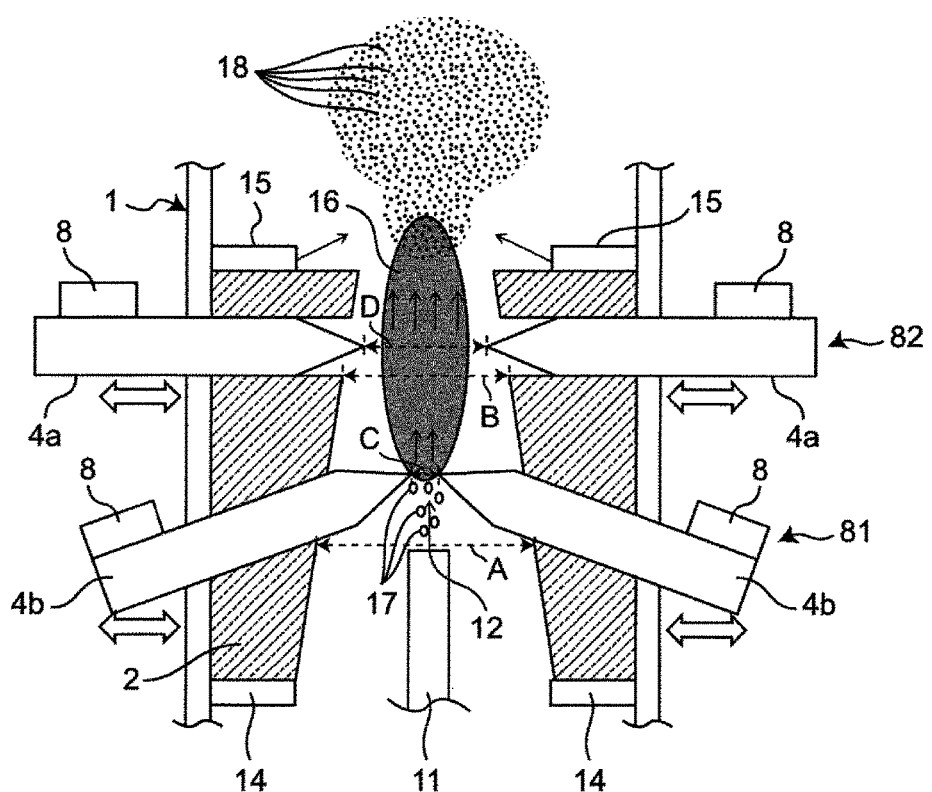
FIG. 3 is an enlarged view of a vicinity of the electrodes in the production apparatus for fine particles according to the first embodiment of the present disclosure.
Figure 4:
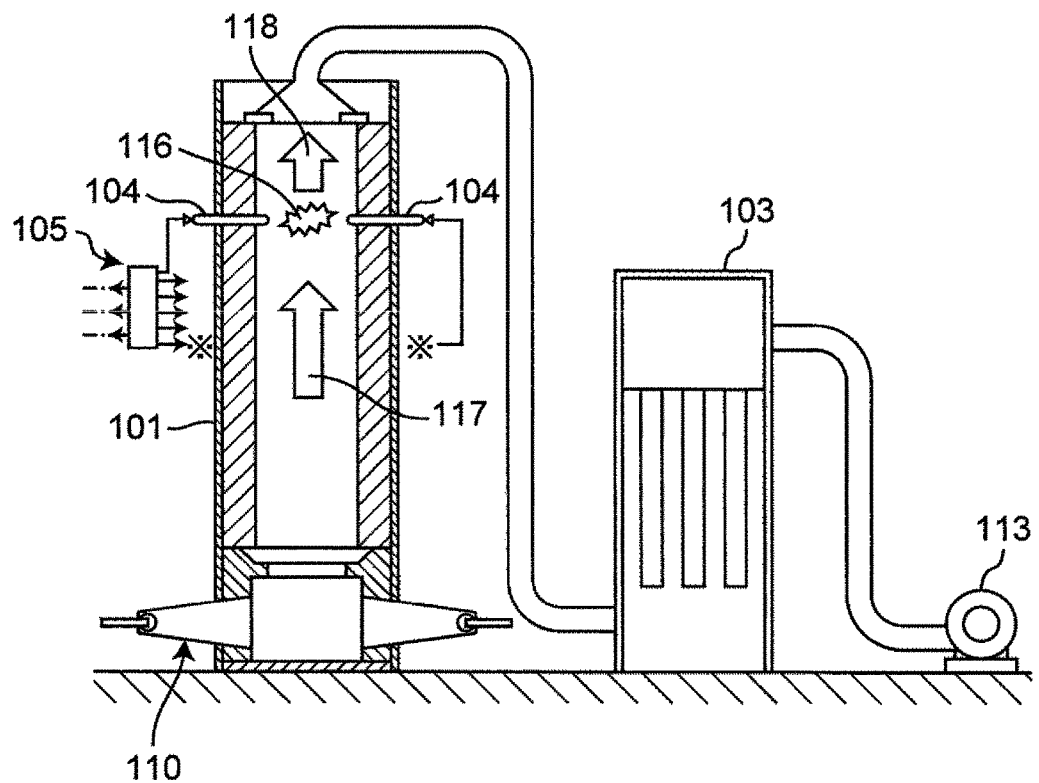
FIG. 4 is a schematic cross-sectional view of a production apparatus for fine particles according to PTL 1.

FIG. 1 shows a schematic cross-sectional view of a production apparatus for fine particles according to a first embodiment. FIG. 2A shows a schematic plan view in the vicinity of upper electrodes in a state where the production apparatus for fine particles according to the first embodiment is cut at an electrode part in a horizontal direction. FIG. 2B shows a schematic plan view in the vicinity of lower electrodes in the state of FIG. 2A. FIG. 3 shows an enlarged view in the vicinity of the electrodes of the production apparatus for fine particles according to the first embodiment. An example of producing fine particles of silicon in the order of nanometers will be explained as an example with reference to FIG. 1 to FIG. 3.

The production apparatus for fine particles according to the first embodiment includes at least a reaction chamber 1 as an example of a vacuum chamber, a material supply device 10, a plurality of upper electrodes 4a and lower electrodes 4b for generating an arc discharge 16 and a fine particle collection section 3 as an example of a collection device for collecting generated fine particles 18, in which the arc discharge 16 is generated inside the reaction chamber 1 and the fine particles 18 are produced from material particles 17.

Furthermore, the production apparatus for fine particles according to the first embodiment is provided with a material supply pipe 11, discharge gas supply pipes 14 for controlling the flow of the material particles 17 and a material gas obtained by vaporizing the material and cooling gas supply pipes 15 for cooling the vaporized material gas in addition to the above structure. Moreover, a pressure regulation valve 6 and an exhaust pump 7 are provided in a subsequent stage of the fine particle collection section 3 to thereby regulate the pressure inside the reaction chamber 1.

Hereinafter, the structure will be explained in detail.

The material supply device 10 is arranged below a bottom part of the reaction chamber 1, supplying the material particles 17 from a material supply port 12 at an upper end of the material supply pipe 11 upward into the reaction chamber 1 by a carrier gas.

A not-shown water cooling mechanism is provided on a side wall of the reaction chamber 1. Moreover, an inner surface of the side wall of the reaction chamber 1 is covered with a cylindrical heat insulating member 2 made of a carbon material for holding the heat of the arc discharge 16. As shown in FIG. 3, the heat insulating member 2 has a structure in which a diameter of an inner wall in the vicinity of the upper electrodes (diameter on an inner side of an electrode installation place on the collection section's side) is smaller than a diameter of an inner wall in the vicinity of the lower electrodes (diameter on an inner side of an electrode installation place in the vicinity of the material supply port 12) (a reserve-tapered structure in a vertical cross-sectional shape in which a vertical upward diameter is reduced). That is, a through hole having a shape tapering toward an upper part (in other words, a frustum shape) is contained inside the cylindrical heat insulating member 2. As a specific example of the heat insulating member 2, a carbon-based material can be used as a material for the heat insulating member 2, however, a material into which an impurity hardly enters (for example, a ceramic-based material and so on) may be used depending on the kinds of fine particles to be produced or types of devices to be used. Here, a ratio A/B of the diameters is preferably 1 or more and 2.5 or less. When A/B is lower than "1", the flow of gas is diffused and it is difficult to obtain the advantage. When A/B is higher than 2.5, the heat insulating member 2 in the vicinity of the lower electrodes becomes thin and a heat insulating effect is lost, therefore, processing efficiency is lowered.

The discharge gas supply pipes 14 are plural discharge gas supply pipes on a lower side of the reaction chamber 1, which are radially arranged on the lower side of the heat insulating member 2 at given intervals around a central axis of the reaction chamber 1 so as to supply a discharge gas toward the center of the reaction chamber 1. Specifically, openings of respective discharge gas supply pipes 14 are arranged on the lower side of the reaction chamber 1 than the material supply port 12, supplying the discharge gas from a gas supply device 30 through gas flow-rate regulators 31. For example, the discharge gas supply pipes 14 are configured to supply the gas as a swirling flow by jetting the gas vertically upward at 30 degrees from a horizontal surface as shown in FIG. 3 as well as in directions of normal lines at 45 degrees from the horizontal surface as shown in FIG. 2B. The discharge gas supply pipes 14 supplies the gas vertically upward at 30 degrees as well as in directions of normal lines at 45 degrees as described above. However, the present disclosure is not limited to this, and the gas flow toward the central part may be generated by the discharge supply pipes 14 in a region between the upper electrodes 4a and the lower electrodes 4b.

The cooling gas supply pipes 15 are plural cooling gas supply pipes on an upper side of the reaction chamber 1, which are radially arranged on the upper side of the heat insulating member 2 at given intervals around the central axis of the reaction chamber 1 so as to supply a cooling gas toward the center of the reaction chamber 1. Specifically, openings of respective cooling gas supply pipes 15 are arranged on the upper side of the reaction chamber 1 than the upper electrodes 4a, supplying the cooling gas from the gas supply device 30 through the gas flow-rate regulators 31. For example, the cooling gas supply pipes 15 efficiently cool the gas evaporated and vaporized by the arc discharge 16 by jetting the cooling gas vertically upward at 30 degrees from a horizontal surface as shown in FIG. 3 as well as in directions of normal lines from the horizontal surface as shown in FIG. 2A, thereby controlling a particle diameter of the fine particles to be produced.

The upper electrodes 4a and the lower electrodes 4b are respectively arranged in an upper part and a lower part of the heat insulating member 2 so as to be arranged in two stages vertically with a given gap. Specifically, the lower electrodes 4b and the upper electrodes 4a have a first electrode arrangement region (lower electrode arrangement region) 81 on the material supply port's side and a second electrode arrangement region 82 (upper electrode arrangement region) 82 which is apart from the first electrode arrangement region 81 to the fine particle collection section's side which respectively cross (for example, are orthogonal to) a direction in which the material particles 17 flow (for example, a direction from below to above) between the vicinity of the material supply port 12 and the fine particle collection section 3. Each of regions 81 and 82 is configured by, for example, one plane, in which plural electrodes 4b/4a are arranged so as to be inclined at a given angle along the surface or with respect to the surface at intervals of given angles in the plane.

As an example, the upper electrodes 4a and the lower electrodes 4b made of metal for generating the arc discharge 16 may be vertically arranged at two stages in parallel so that six upper electrodes 4a in the second electrode arrangement region 82 and six lower electrodes 4b in the first electrode arrangement region 81, namely, the total twelve electrodes are radially arranged respectively on an inner peripheral wall of the reaction chamber 1 at intervals of 60 degrees in a state where tip ends protrude into the reaction chamber 1 in the horizontal direction (for example, the upper electrodes 4a are inclined vertically upward at 5 degrees with respect to the horizontal direction and the lower electrodes 4b are inclined vertically upward at 30 degrees with respect to the horizontal direction) as shown in FIG. 1 to FIG. 3.

The above inclination is an angle of inclination, specifically, the angle of inclination is an angle made by a longitudinal direction of the bar-shaped upper electrodes 4a or the lower electrodes 4b and the horizontal direction as a direction orthogonal to the vertical direction. That is, the angle of inclination of the lower electrodes 4b is larger than the angle of inclination of the upper electrodes 4a.

The upper electrodes 4a and the lower electrodes 4b are respectively formed of metal electrodes, and evaporation of the metal electrodes is reduced by water cooling and by allowing the cooling gas to flow therein so that a metal material is not mixed as an impurity of the fine particles 18 to be produced. A tungsten electrode as a high-melting point metal can be used as an example of the material for the upper and lower electrodes 4a and 4b, and electrodes made of other high-melting point metals such as tantalum or the carbon material may be used instead of the tungsten electrode.

In the embodiment, six upper electrodes 4a and six lower electrodes 4b are radially arranged in two stages as an example, however, it is possible to increase the number of electrodes, to arrange twelve electrodes on the same plane, to arrange six lower electrodes and twelve upper electrodes in two states and to arrange electrodes in further increased stages such as in three stages as long as the number of electrodes is a multiple of 6. Multi-phase AC arc plasma as an example of plasma generated by the electrodes having the above structures have a higher degree of freedom in electrode arrangement as compared with a method for generating other thermal plasma, therefore, the size or the shape of the arc discharge (thermal plasma) 16 for evaporating the material particles 17 can be designed freely. Accordingly, the multi-phase AC arc plasma can have an arbitrary discharge shape according to processing such as a vertically long discharge and a discharge with a two-dimensionally large area, therefore, processing efficiency can be improved and a processing amount can be increased.

Upper and lower AC power sources 5a and 5b each having n-pieces ("n" is an integer of 2 or more, for example, when six electrodes are respectively arranged, n=6), specifically, an upper first AC power source 5a-1, an upper second AC power source 5a-2, an upper AC third AC power source 5a-3, . . . an upper n-th AC power source 5a-n and a lower first AC power source 5b-1, a lower second AC power source 5b-2, a lower third AC power source 5b-3, . . . an lower n-th AC power source 5b-n are connected to the upper and lower electrodes 4a and 4b, and Ac power phases of which are shifted is applied respectively to the plural upper electrodes 4a and the plural lower electrodes 4b from the AC power sources 5a and 5b respectively, thereby generating the arc charge 16 as thermal plasma.

The upper and lower electrodes 4a and 4b are configured to be movable forward and backward in directions of radial lines with respect to the center of the reaction chamber 1 independently by electrode drive devices 8 formed by motors or the like. As the electrode drive devices 8, for example, ball screws are rotated normally and reversely by motors to thereby advance and retract the electrodes 4a and 4b connected to nut members screwed to the ball screws in an axial direction.

A diameter (C) of a circle formed by respective tip ends of the lower electrodes 4b is substantially narrower than a diameter (A) of an inner wall of the heat insulating member 2 in the vicinity of the lower electrodes, and a diameter (D) of a circle formed by respective tip ends of the upper electrodes 4a is approximately equivalent to a diameter (B) of an inner wall of the heat insulating member 2 in the vicinity of the upper electrodes. According to the structure, the material is easily introduced into the arc discharge 16 generated by the lower electrodes 4b without being interrupted by the flow of gas from the discharge gas supply pipes 14, and the material particles 17 are also introduced into the arc discharge generated by the upper electrodes 4a easily by the flow of gas from the discharge gas supply pipes 14 or the flow toward the center from the outside due to the shape of the heat insulating member 2, which improves processing efficiency.

Moreover, the diameter (D) of the circle is larger than the diameter (C) of the circle as shown in FIG. 1, FIGS. 2A, 2B and FIG. 3.

The fine particle collection section 3 is arranged so as to be connected to an upper end of the reaction chamber 1 which is exhausted by the pump 7 through a pipe 80, collecting fine particles 18 generated in the reaction chamber 1. The plural electrodes 4a and 4b are arranged vertically in two stages with a given gap so that tip ends protrude inside at side parts of an intermediate position of the reaction chamber 1, generating thermal plasma (namely, the arc discharge) 16 inside the reaction chamber 1 to thereby produce the fine particles 18 from the material particles 17 supplied from the material supply device 10 by the generated thermal plasma 16.

A controller 100 is respectively connected to the material supply device 10, the fine particle collection section 3, the pressure regulation valve 6, the exhaust pump 7, the gas supply device 30, the respective gas flow-rate regulators 31, the AC power sources 5a, 5b and the respective electrode drive devices 8 so as to control respective operations.

A production method for fine particles using the production apparatus for fine particles according to the structure includes at least three steps of generating the thermal plasma 16, supplying the material particles 17 to the thermal plasma 16 and generating the fine particles 18. These operations can be automatically performed by being controlled by the controller 100.

When the thermal plasma 16 is generated, the AC power phases of which differ from one another is respectively applied to the upper and lower electrodes 4a and 4b arranged in parallel in two stages or more in the direction in which the material particles 17 flow inside the reaction chamber 1, thereby generating the vertically long thermal plasma 16 toward the direction in which the material particles 17 flow (namely, from below to above).

Subsequently, when the material particles 17 are supplied to the thermal plasma, the material particles 17 are supplied to a region of the thermal plasma 16 from the material supply port 12 of the material supply device 10.

Next, when the fine particles 18 are generated, the material particles 17 are evaporated or vaporized to generate a material gas when passing through the region of the thermal plasma 16, and the material gas is rapidly cooled at a moment when the material gas exits from the region of the thermal plasma 16 to thereby generate the fine particles 18.

Hereinafter, the production method for fine particles will be explained in detail along a procedure which is actually performed.

First, the reaction chamber 1, the fine particle collection section 3 and the material supply device 10 are exhausted by the exhaust pump 7 to be several 10 Pa in pressure, thereby reducing the influence of oxygen in the air.

Next, the gases are supplied to the material supply device 10, the discharge gas supply pipe 14 and the cooling gas supply pipe 15 respectively from the gas supply device 30 through the gas flow-rate regulators 31, regulating the pressure inside the reaction chamber 1 by the pressure regulation valve 6 attached in the previous stage of the exhaust pump 7. The gas is supplied from a plurality of supply ports from the discharge gas supply pipes 14 on the lower side of the reaction chamber 1 to be jetted vertically upward from the horizontal surface at 30 degrees as shown in FIG. 3 and in directions of normal lines at 45 degrees from the horizontal surface as shown in FIG. 2B, thereby supplying the gas as the swirling flow.

The cooling gas supply pipes 15 on the upper side of the reaction chamber 1 supplies the gas from a plurality of supply ports into the reaction chamber 1 and jetting the cooling gas vertically upward from the horizontal surface at 30 degrees as shown in FIG. 3 and in directions of normal lines from the horizontal surface as shown in FIG. 2A, thereby efficiently cooling the gas evaporated and vaporized by the arc discharge 16 and controlling the particle diameter of the fine particles 18 to be produced.

As an example of the first embodiment, argon is supplied into the reaction chamber 1 from the gas supply device 30 through the discharge gas supply pipes 14 and the cooling supply pipes 15 respectively for producing fine particles of silicon to perform the following production processes for fine particles while maintaining the inside of the reaction chamber 1 at a desired pressure of 0.3 atmospheric pressure or more to 1.2 atmospheric pressure or less in an inert gas atmosphere of argon. The inert gas is used as the discharge gas and the cooling gas in this case and, for example, argon is used for both gases. It is also preferable to mix a slight amount of hydrogen gas and a slight amount of carbonized gas to be introduced into the reaction chamber 1 from the gas supply device 30 through the discharge gas supply pipe 14 and the cooling gas supply pipe 15 for promoting the reduction of the material. It is also preferable to mix a slight amount of oxygen gas, nitrogen gas or carbonized gas for oxidizing, nitriding or carbonizing the material for coating the material with a carbon film.

Next, the arc discharge 16 (in other words, thermal plasma) is generated. As an example, the upper electrodes 4a and the lower electrodes 4b made of metal for generating the arc discharge 16 are vertically arranged at two stages in parallel so that six upper electrodes 4a and six lower electrodes 4b, namely, the total twelve electrodes are radially arranged on the inner peripheral wall of the reaction chamber 1 at intervals of 60 degrees in a state where tip ends protrude into the reaction chamber 1 in the horizontal direction (for example, the upper electrodes 4a are inclined vertically upward at 5 degrees with respect to the horizontal direction and the lower electrodes 4b are inclined vertically upward at 30 degrees with respect to the horizontal direction) as shown in FIG. 1 to FIG. 3.

The AC power phases of which are shifted is applied to the upper and lower electrodes 4a and 4b from the upper and lower AC power sources 5a and 5b. As an example, the AC power of 60 Hz phases of which are shifted by 60 degrees is applied to six upper electrodes 41 and six lower electrodes 4b respectively from the AC power sources 5a and 5b each having six power sources to thereby generate the vertically long arc discharge 16 as thermal plasma of approximately 10000° C. As an example, the AC power phases of which are shifted by 60 degrees may be applied respectively when there are six upper electrodes 4a and six lower electrodes 4b, however, it is also preferable that AC power of 60 Hz phases of which are shifted by 30 degrees is applied to twelve electrodes including the upper electrodes 4a and the lower electrodes 4b. Accordingly, upper and lower arc discharges 16 are easily connected, a further vertically longer arc discharge 16 can be formed and in-plane distribution is also improved.

When the arc discharge 16 is ignited after the AC power is applied, an arbitrary two or three of each of the upper and lower electrodes 4a and 4b are moved to the center side of the reaction chamber 1 by the electrode drive device 8. After the arc discharge 16 is ignited, electric current applied to respective upper and lower electrodes 4a and 4b are regulated to be constant, and respective upper and lower electrodes 4a and 4b are moved to directions of radial lines (directions toward the outside from the central position of the circle formed by respective tip ends of respective upper and lower electrodes 4a and 4b which are radially arranged) by the electrode drive device 8 so that the upper and lower electrodes 4a and 4b are respectively placed as desired positions. As an example, the electrodes are arranged so that the diameter (C) of the circle formed by respective tip ends of the lower electrodes 4b is smaller than the diameter (D) of the circle formed by respective tip ends of the upper electrodes 4a. As the lower electrodes 4b are positioned extremely close to the material supply port 12 in this structure, the probability that the material particles 17 introduced from the material supply port 12 are introduced into the arc discharge (high-temperature region) 16 generated by the lower electrodes 4b is high. Moreover, the smaller the discharge area is, the higher the power density and the temperature become, therefore, it is preferable that the diameter (C) of the circle formed by respective tip ends of the lower electrodes 4b is smaller. On the other hand, the upper electrodes 4a are positioned apart from the material supply port 12 and materials processed in the arc discharge 16 by the lower electrodes 4b or unprocessed materials flowing from the material supply port 12 increase the distribution of the material particles 17 to be extremely large, therefore, the processing efficiency is increased when the diameter (D) of the circle formed by respective tip ends of the upper electrodes 4a is larger.

Here, a ratio C/D of the diameters of the circles is preferably 0.5 or more to 1 or less. When C/D is lower than 0.5, the discharge by the upper electrodes 4a becomes too wide, therefore, a region where discharge does not occur is increased. When C/D is higher than 1, the upper electrodes 4a enter the arc discharge (high-temperature region) 16 generated by the lower electrodes 4b, therefore, damages to the upper electrodes 4a are large and electrode consumption is also large. Accordingly, it is highly likely that impurities (contaminations) are also increased.

Next, the supply of the material to be processed is started. As an example, silicon powder having approximately 16 micrometers is used as the material particles 17 as a raw material for the fine particles 18, which is set inside the material supply device 10. Though the particles having 16 micrometers are used in the first embodiment, particles having particle diameters of 100 micrometers or less are evaporated by the thermal plasma 16 and the fine particles 18 in the order of nanometers depending on plasma conditions can be produced. When materials having particle diameters larger than 100 micrometers are used, it is difficult to completely evaporate the material and fine particles to be generated may be increased to have a size in micrometer order.

A partial fluidized-type powder supply device is used as an example of the material supply device 10. In the partial fluidized-type powder supply device, a supply amount of the material is controlled according to the flow rate of a carrier gas and a rotation speed of a vessel into which the material is introduced, thereby feeding the powder material to the material supply pipe 11 at a constant rate. As other examples of the material supply device 10, there are a surface copying-type powder feeder that controls a distance between the surface of the powder material and a nozzle by using laser or the like, a quantitative-type powder feeder that supplies a quantitative powder material into a groove from a hopper or the like and sucks the material and other devices. Any type of power material supply device may be used. However, the proper types of powder material supply devices used depend on the amount of the powder material to be supplied, the kind or the particle diameter of the powder material.

As shown in FIG. 1 to FIG. 3, the material particles 17 are fed into the material supply pipe 11 from the material supply device 10, then, introduced into the reaction chamber 1 from the material supply port 12. The material particles 17 introduced into the reaction chamber 1 are evaporated and vaporized when passing through the arc discharge 16, and the material particles 17 are gasified.

According to the first embodiment, the gas is supplied from the discharge gas supply pipes 14 on the vertically lower side of the arc discharge 16 as the swirling flow by the flow toward the center from the outside, thereby promoting the flow of the gas toward the arc discharge 16 at the center between the upper electrodes 4a and the lower electrodes 4b. As the material particles 17 are allowed to be close to a strong upward current at the center generated by the arc discharge 16, the material particles 17 are attracted to the upward current at the center and easily introduced into the arc discharge 16 generated by the upper electrodes 4a, which can improve processing efficiency of the material.

The evaporated material gas moves upward in the reaction chamber 1 by the upward current due to heat of the arc discharge 16 or the gas flow from the discharge gas supply pipes 14, and the material gas is rapidly cooled by the cooling gas supply pipes 15 at a moment when exiting from the arc discharge 16, thereby generating spherical fine particles 18.

In general, heat of plasma is deprived by evaporation of the material particles 17 in the arc discharge (thermal plasma) at a place where the material is supplied, therefore, the temperature of plasma at the place where the material is evaporated is reduced. In a case where the material is sequentially inputted to continuous discharge such as a common inductively-coupled plasma (ICP) torch in a related art, the temperature of plasma is reduced by evaporation of the material, therefore, it is difficult to completely evaporate the material and fine particles having a relatively large size are generated, which deteriorates distribution of particle diameters. There is no choice but to limit the input amount of material for producing fine particle having a desired particle diameter or for improving the distribution of particle diameters of produced particles, which reduces the processing amount.

In response to the above, the arc discharge (multi-phase AC arc plasma) 16 generated by the upper and lower electrodes 4a and 4b used in the first embodiment has a pulse shape as the AC power phases of which differ from one another is applied, therefore, thermal plasma having a high temperature can be constantly generated.

As thermal plasma such as the arc discharge 16 or the ICP torch is a viscous gas, the material particles 17 are not introduced into the arc discharge 16 and is not processed if the material particles 17 have a certain velocity. Accordingly, when the upper electrodes 4a or the lower electrodes 4b are inclined in the direction in which the gas flows or the material particles 17 flow, the material particles 17 can be easily introduced into the arc discharge 16 by the flow of gas or discharge, which can increase processing efficiency.

In the apparatus in which the material supply device 10 and the material supply port 12 are installed on the vertically lower side of the arc discharge 16 and the material particles 17 are supplied from the vertically lower side of the arc discharge 16, unprocessed material particles repelled by the arc discharge 16 fall down vertically to the lower side due to gravity, which can be separated from the fine particles 18 positioned in an upper part of the arc discharge 16 and have been processed. These unprocessed material particles are collected in an unprocessed material reservoir 86 partitioned by a cover 13 on a bottom of the reaction chamber 1 below the material supply port 12. The material collected in the unprocessed material reservoir 86 can be also returned to the material supply device 10 and reused, which can increase efficiency of using the material.

Lastly, the fine particles 18 generated by the arc discharge 16 are carried to the fine particle collection section 3 by the gas flow from the discharge gas supply pipes 14, the upward current by the arc discharge 16 or the flow by the exhaust of the gas as shown in FIG. 1. The fine particle collection section 3 is provided with a cyclone that can classify fine particles having an arbitrary diameter or more and a bag filter that can collect desired particles. As there is a danger of ignition when the collected fine particles are taken out to the air, fine particles are left under an atmosphere containing approximately 1% of the air (gas containing oxygen) for several hours and slowly oxidized, then, taken out to the air. Accordingly, surfaces of silicon fine particles are oxidized 1 or more and 3 or less nanometers, and the fine particles can be taken out safely. According to the above processes, silicon fine particles having diameters of 10 or more and 300 or less nanometers can be collected from the bag filter.

The method of producing fine particles of silicon (Si) in the order of nanometers has been explained in the first embodiment, however, it is also possible to produce fine particles by using nickel (Ni), silver (Ag), carbon materials such as fullerene or nanotube, metals such as copper (Cu), glass ($SiO_2$), silicon nitride (SiN), silicon carbide (SiC), alumina ($Al_2O_3$) and inorganic materials such as boron nitride (BN) as materials for producing fine particles. It is also preferable to generate fine particles of silicon monoxide ($SiO_x$: x=1 to 1.6), silicon nitride ($SiN_x$: x=0.1 to 1.3) or silicon carbide ($SiC_x$: x=0.1 to 1) by using silicon materials. Furthermore, the present disclosure can be utilized for generation of composite materials containing plural materials having a silicon core inside and covered with amorphous silicon oxide, alumina, silicon carbide or the like on the outer side.

According to the first embodiment, the first electrode arrangement region 81 on the material supply port's side and the second electrode arrangement region 82 apart from the first electrode arrangement region 81 to the fine particle collection section's side which respectively cross the direction in which the material particles 17 flow between the vicinity of the material supply port 12 and the fine particle collection section 3 are provided at the intermediate position of the reaction chamber 1, a plurality of electrodes 4b and 4a are arranged in multi-stages in the first electrode arrangement region 81 and the second electrode arrangement region 82 respectively. The arc discharge 16 is provided in multi-stages as described above, thereby increasing the probability that the supplied material particles 17 pass through the region of the arc discharge 16 and reducing unprocessed material. As the total amount of heat which can be given to all the material particles 17 is increased, drastic improvement of processing efficiency and processing velocity can be expected.

Figure 5:
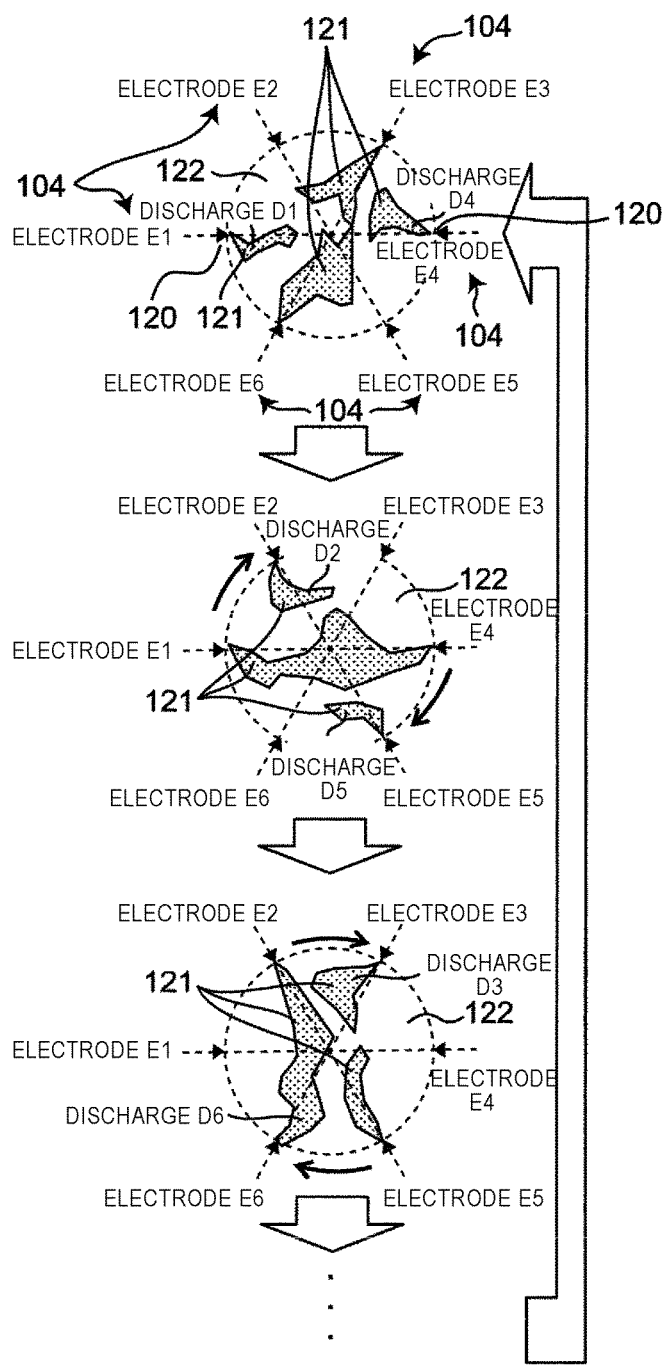
FIG. 5 show schematic views of a discharge state of multi-phase AC arc plasma at a certain moment.

The multi-phase AC arc plasma used in the first embodiment is also the same as the multi-phase AC arc plasma disclosed in PTL 1 shown in FIG. 5, which has a complicated discharge form in which both the region 121 where discharge occurs and a region 122 where discharge does not occur exist temporarily and two-dimensionally. In FIG. 5, the region 121 where discharge occurs is represented as a hatched region, and the region 122 where discharge does not occur is represented as a region without hatching. Many material particles 17 introduced from the material supply port 12 into the arc discharge 16 generated by the lower electrodes 4b which are repelled to a wall side of the heat insulating member 2 due to the presence of the arc discharge region 121 or complicated upward current according to the above discharge form. That is, the discharge of the multi-phase AC arc plasma is complicated, therefore, the gas flow in the vicinity of the arc discharge region 121 by the upward current and so on due to the arc discharge 16 is also complicated, therefore, there is a case in which it is difficult to drastically improve processing efficiency and processing velocity as expected just by forming the arc discharge 16 in multi-stages in the direction in which the material particles 17 pass. Accordingly, the heat insulating member 2 is formed to have the structure in which the diameter (B) of the inner wall in the vicinity of the upper electrodes is smaller than the diameter (A) of the inner wall in the vicinity of the lower electrodes (reserve-tapered structure in which a vertical upward diameter is reduced) in the first embodiment for improving the processing efficiency and processing velocity more positively.

According to the above structure, the gas flow toward the region of the arc discharge 16 at the center is generated between the upper electrodes 4a and the lower electrodes 4b. Accordingly, the material particles 17 repelled to the wall side of the heat insulating member 2 or the gas generated by evaporating the material particles 17 are allowed to be close to the region of the arc discharge 16 at the center and to be sucked by the upward current again. As a result, the probability that the material particles 17 are introduced into the arc discharge 16 generated by the upper electrodes 4a is increased and efficiency of evaporating the material can be increased.

Arbitrary embodiments and modification examples in the above various embodiments or modification examples are suitably combined, thereby realizing effects given by respective examples. It is possible to combine embodiments with each other, to combine examples with each other and to combine an embodiment with an example as well as to combine different embodiments with each other as well as to combine features in embodiments with each other.

In the production apparatus and the production method for fine particles according to the aspects of the present disclosure, processing efficiency of the material can be increased and a large amount of material can be processed. Therefore, fine particles can be produced at low costs. Accordingly, the aspects of the present disclosure are useful for the production apparatus and the production method for fine particles used for devices requiring mass production such as a lithium-on secondary battery or a ceramic capacitor.

What is claimed is:

1. A production apparatus for fine particles comprising:
   a vacuum chamber;
   a material supply device connected to one end side of the vacuum chamber and supplying material particles to the vacuum chamber from a material supply port;
   plural electrodes arranged in an intermediate part of the vacuum chamber and generating plasma inside the vacuum chamber when AC power phases of which differ from one another are applied to respective electrodes; and
   a collection device connecting to an other end of the vacuum chamber and collecting fine particles, which generates plasma in the vacuum chamber and produces fine particles from the material particles,
   wherein a first electrode arrangement region on the material supply port's side and a second electrode arrangement region apart from the first electrode arrangement region to the collection device's side which respectively cross a direction in which the material flows between a vicinity of the material supply port and the collection device are provided in the intermediate part of the vacuum chamber,
   both the first electrode arrangement region and the second electrode arrangement region are provided with the plural electrodes respectively to form the electrodes in multi-stages, and
   an angle of inclination of the electrodes arranged in the first electrode arrangement region is larger than an angle of inclination of the electrodes arranged in the second electrode arrangement region.

2. The production apparatus for fine particles according to claim 1,
   wherein a diameter of a circle formed by respective tip ends of the plural electrodes arranged in the second electrode arrangement region is larger than a diameter of a circle formed by respective tip ends of the plural electrodes arranged in the first electrode region.

3. The production apparatus for fine particles according to claim 1,
   wherein a heat insulating member installed inside the vacuum chamber has a shape in which a diameter of an inner side of an electrode installation place on the collection device's side is smaller than a diameter of an inner side of an electrode installation place in the vicinity of the material supply port.

4. The production apparatus for fine particles according to claim 1, further comprising:
   discharge gas supply pipes capable of supplying a discharge gas from an opposite side of the material supply port in an electrode installation direction.

5. The production apparatus for fine particles according to claim 1,
   wherein AC power sources are respectively connected to the plural electrodes and AC power phases of which differ from one another is applied to the plural electrodes respectively from the AC power sources to thereby generate arc discharge as the plasma inside the vacuum chamber.

6. A production method for fine particles comprising the steps of:
   generating thermal plasma by applying AC power phases of which differ from one another to plural electrodes respectively, which are formed in multi-stages by being arranged respectively in a first electrode arrangement region on a material supply port's side and a second electrode arrangement region apart from the first electrode arrangement region to a fine particle collection device's side which respectively cross a direction in which material particles flow in a discharge gas in a vacuum chamber between a vicinity of the material supply port and the fine particle collection device which are provided in an intermediate part of the vacuum chamber, in which an angle of inclination of the electrodes arranged in the first electrode arrangement region is larger than an angle of inclination of the electrodes arranged in the second electrode arrangement region;
   supplying the material particles into a region of the thermal plasma from the material supply port of a material supply device; and
   generating fine particles by evaporating and vaporizing the material particles to generate a material gas when passing through the region of the thermal plasma and by cooling the material gas rapidly at a moment when the material gas exits from the region of the thermal plasma.

7. The production method for fine particles according to claim 6,
   wherein a diameter of a circle formed by respective tip ends of the plural electrodes arranged in the second electrode arrangement region is larger than a diameter of a circle formed by respective tip ends of the plural electrodes arranged in the first electrode region.

8. The production method for fine particles according to claim 5,
   wherein the plasma is arc discharge performing pulsed discharge by supplying power phases of which differ from one another from AC power sources to the plural electrodes respectively.

9. The production method for fine particles according to claim 5,
   wherein the plasma is arc discharge generated by electrodes arranged in parallel so as to be two stages or more in a direction in which the material flows, which is vertically long discharge toward the direction in which the material flows or a high-temperature region is vertically long.

10. The production method for fine particles according to claim 6, further comprising:
    forming a swirling flow in the vicinity of the electrodes by supplying the discharge gas from an opposite side of the material supply port in an electrode installation direction.

11. The production apparatus for fine particles according to claim 1,
    further including a heat insulating member installed inside the vacuum chamber to insulate the vacuum chamber,
    wherein the heat insulating member includes a carbon material.

12. The production apparatus for fine particles according to claim 1,
    further including a heat insulating member installed inside the vacuum chamber to insulate the vacuum chamber,
    wherein the heat insulating member includes a ceramic material.

13. The production apparatus for fine particles according to claim 2,
    wherein a ratio of the diameter of a circle formed by respective tip ends of the plural electrodes arranged in the second electrode arrangement region to the diameter of a circle formed by respective tip ends of the plural electrodes arranged in the first electrode region is 0.5 or more to 1 or less.

14. The production apparatus for fine particles according to claim 1,
wherein a number of the plural electrodes is a multiple of 6.

* * * * *